(12) United States Patent
Lin et al.

(10) Patent No.: US 8,981,391 B2
(45) Date of Patent: Mar. 17, 2015

(54) DISPLAY PANEL WITH HIGH TRANSPARENCY

(71) Applicant: Industrial Technology Research Institute, Hsinchu (TW)

(72) Inventors: Jui-Ying Lin, Taipei (TW); Chia-Hsin Chao, Taichung (TW); Kuang-Yu Tai, Hsinchu (TW); Wen-Yung Yeh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/923,376

(22) Filed: Jun. 21, 2013

(65) Prior Publication Data

US 2013/0341659 A1   Dec. 26, 2013

Related U.S. Application Data

(60) Provisional application No. 61/662,931, filed on Jun. 22, 2012.

(30) Foreign Application Priority Data

May 31, 2013   (TW) .............................. 102119355 A

(51) Int. Cl.
*H01L 33/00* (2010.01)
*H01L 27/15* (2006.01)
(Continued)

(52) U.S. Cl.
CPC .............. *H01L 27/156* (2013.01); *H01L 27/32* (2013.01); *H01L 27/3283* (2013.01);
(Continued)

(58) Field of Classification Search
CPC .................. H01L 2251/5323; H01L 27/3211; H01L 27/3246
USPC ................................................ 257/88, 89, 91
See application file for complete search history.

(56) References Cited

U.S. PATENT DOCUMENTS 4,306,716 A * 12/1981 James et al. .................... 463/31
5,742,129 A *  4/1998 Nagayama et al. .......... 315/167
(Continued)

FOREIGN PATENT DOCUMENTS

CN       102130148       7/2011
TW       201007258       2/2010
(Continued)

OTHER PUBLICATIONS

Park et al., "Printed Assemblies of Inorganic Light-Emitting Diodes for Deformable and Semitransparent Displays" with the supporting material therefor, Science, Aug. 20, 2009, vol. 325, p. 1-51.
(Continued)

*Primary Examiner* — Matthew E Warren
(74) *Attorney, Agent, or Firm* — Jianq Chyun IP Office

(57) ABSTRACT

A display panel including a substrate, a meshed shielding pattern, and a plurality of light-emitting devices is provided. The meshed shielding pattern is disposed on the substrate so as to define a plurality of pixel regions on the substrate. The light-emitting devices are disposed on the substrate. At least one light-emitting device of the light-emitting devices is disposed in each pixel region of the pixel regions, wherein an area of the pixel region is A1, an area of the light-emitting device is A2, and a ratio of A2 to A1 is below 50%.

8 Claims, 5 Drawing Sheets

(51) Int. Cl.
*H01L 27/32* (2006.01)
*H01L 51/52* (2006.01)

(52) U.S. Cl.
CPC ........ *H01L 51/5284* (2013.01); *H01L 27/3209* (2013.01); *H01L 27/3211* (2013.01); *H01L 27/322* (2013.01); *H01L 27/3232* (2013.01); *H01L 2251/5323* (2013.01)
USPC .................................. 257/88; 257/89; 257/91

(56) References Cited

U.S. PATENT DOCUMENTS

| | | | |
|---|---|---|---|
| 6,922,015 B2 * | 7/2005 | Park et al. .................... | 313/506 |
| 8,314,859 B2 | 11/2012 | Kim et al. | |
| 8,319,419 B2 * | 11/2012 | Kodama et al. ............. | 313/503 |
| 8,659,724 B2 * | 2/2014 | Hagiwara et al. ............ | 349/106 |
| 2003/0107537 A1 * | 6/2003 | Ochi et al. .................... | 345/83 |
| 2004/0017151 A1 * | 1/2004 | Kim et al. .................... | 313/504 |
| 2004/0017152 A1 * | 1/2004 | Hashimoto et al. .......... | 313/505 |
| 2004/0119066 A1 * | 6/2004 | Han et al. ..................... | 257/40 |
| 2005/0116620 A1 * | 6/2005 | Kobayashi .................... | 313/503 |
| 2006/0220532 A1 * | 10/2006 | Tanabe et al. ................ | 313/503 |
| 2007/0024822 A1 * | 2/2007 | Cortenraad et al. .......... | 353/79 |
| 2007/0096643 A1 * | 5/2007 | Maglione et al. ............ | 313/506 |
| 2007/0103062 A1 * | 5/2007 | Jung et al. .................... | 313/504 |
| 2007/0132356 A1 * | 6/2007 | Hashimoto et al. .......... | 313/292 |
| 2007/0159089 A1 * | 7/2007 | Oh et al. ....................... | 313/506 |
| 2007/0228937 A1 * | 10/2007 | Akiyoshi ...................... | 313/503 |
| 2008/0150423 A1 * | 6/2008 | Kim et al. .................... | 313/504 |
| 2009/0097230 A1 * | 4/2009 | Masuda et al. ............... | 362/97.2 |
| 2009/0160322 A1 * | 6/2009 | Yoshida et al. .............. | 313/504 |
| 2009/0295943 A1 | 12/2009 | Kim et al. | |
| 2010/0314616 A1 * | 12/2010 | Kodama et al. .............. | 257/40 |
| 2011/0147770 A1 * | 6/2011 | Hwang et al. ................ | 257/89 |
| 2011/0227100 A1 * | 9/2011 | Kurihara et al. ............. | 257/88 |
| 2013/0038921 A1 * | 2/2013 | Kim et al. .................... | 359/296 |
| 2013/0049578 A1 * | 2/2013 | Burroughes et al. ......... | 313/504 |
| 2014/0159066 A1 * | 6/2014 | Hu et al. ....................... | 257/88 |

FOREIGN PATENT DOCUMENTS

| | | |
|---|---|---|
| TW | M412373 | 9/2011 |
| TW | 201142455 | 12/2011 |

OTHER PUBLICATIONS

Yoon et al., "GaAs photovoltaics and optoelectronics using releasable multilayer epitaxial assemblies", NATURE, May 20, 2010, vol. 465, p. 329-334.

Nguyen, "Challenges in the design of a RGB LED display for indoor applications", Synthetic Metals, Feb. 28, 2001, vol. 122, p. 215-219.

Onoe et al., "Temperature-controlled transfer and self-wiring for multi-color light-emitting diode arrays", Journal of Micromechanics and Microengineering, Jun. 23, 2009, vol. 19, p. 1-9.

Jang et al., "Toward Flexible Transparent Plasma Display: Optical Characteristics of Low-Temperature Fabricated Organic-Based Display Structure", IEEE Electron Device Letters, January 2012, vol. 33, p. 74-76.

Kim et al., "Transparent driving thin-film transistor circuits based on uniformly grown single-walled carbon nanotubes network", Device Research Conference 2009, Jun. 22-24, 2009, p. 117-118.

"Office Action of Taiwan Counterpart Application", issued on Nov. 13, 2014, p. 1-6.

* cited by examiner

DISPLAY PANEL WITH HIGH TRANSPARENCY

CROSS-REFERENCE TO RELATED APPLICATION

This application claims the priority benefits of U.S. provisional application Ser. No. 61/662,931, filed on Jun. 22, 2012 and Taiwan application serial no. 102119355, filed on May 31, 2013. The entirety of each of the above-mentioned patent applications is hereby incorporated by reference herein and made a part of this specification.

TECHNICAL FIELD

The disclosure relates to a transparent display panel.

BACKGROUND

The transparent display is a display having a certain degree of inherent transparency, wherein in addition to displaying information or pictures, the transparent display further allows the user to clearly see the background behind the display. Currently, the transparent display is suitable for various applications in, for instance, windows of buildings, car windows, and shopwindows, and has therefore garnered market attention.

However, the current transparent display faces problems such as not having enough transparency and difficulty in displaying deep color. If the transparency of the display is low, the user will clearly perceive the presence of the display and not be able to clearly observe the background behind the display. Moreover, when the average display displays deep color, the deep color pixel regions display lower luminance. However, for the transparent display, if the luminance displayed by the deep color pixel regions is lower, the background behind the pixel regions becomes easily observed. Therefore, the transparent display has the prevalent problem of poor deep color display due to difficulty in grayscale control.

SUMMARY

The disclosure provides a display panel having good transparent display.

The disclosure provides a display panel having good deep color display.

The disclosure provides a display panel. The display panel includes a substrate, a meshed shielding pattern, and a plurality of light-emitting devices. The meshed shielding pattern is disposed on the substrate so as to define a plurality of pixel regions on the substrate. The light-emitting devices are disposed on the substrate. At least one light-emitting device of the light-emitting devices is disposed in each pixel region of the pixel regions, wherein an area of the pixel region is A1, an area of the light-emitting device is A2, and a ratio of A2 to A1 is below 50%.

The disclosure further provides a display panel. The display panel includes a substrate, a meshed shielding pattern, a plurality of light-emitting devices, and a plurality of solar cells. The meshed shielding pattern is disposed on the substrate so as to define a plurality of pixel regions on the substrate. The light-emitting devices are disposed on the substrate. The solar cells are disposed on the substrate, wherein at least one light-emitting device of the light-emitting devices and at least one solar cell of the solar cells are disposed in each pixel region of the pixel regions.

Based on the above, in the display panel of the disclosure, the ratio of the area of the light-emitting device to the area of the pixel region is relatively low, and therefore the transparency of the display panel may be increased. Moreover, solar cells are disposed in the display panel of the disclosure, and when the solar cells absorb light, grayscale control of the display panel may be achieved so as to have better deep color display.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
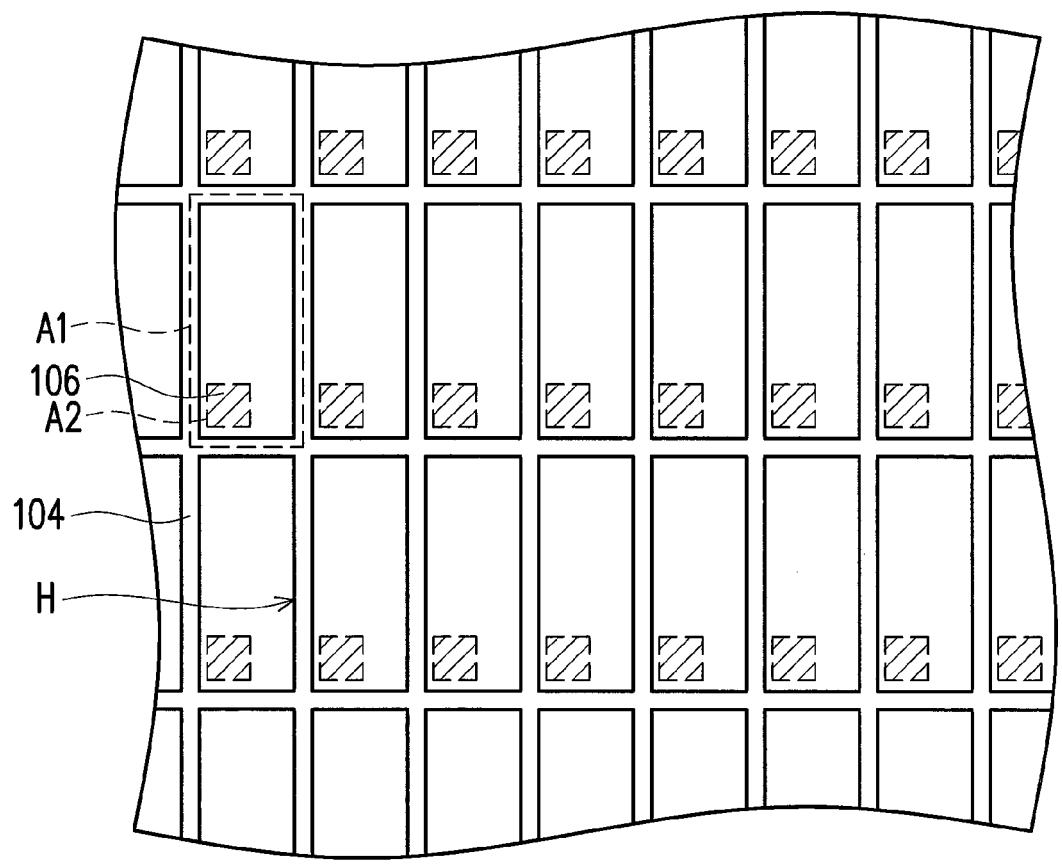
FIG. 1 is a schematic top view of a portion of a display panel of the first embodiment of the disclosure.
Figure 2A:
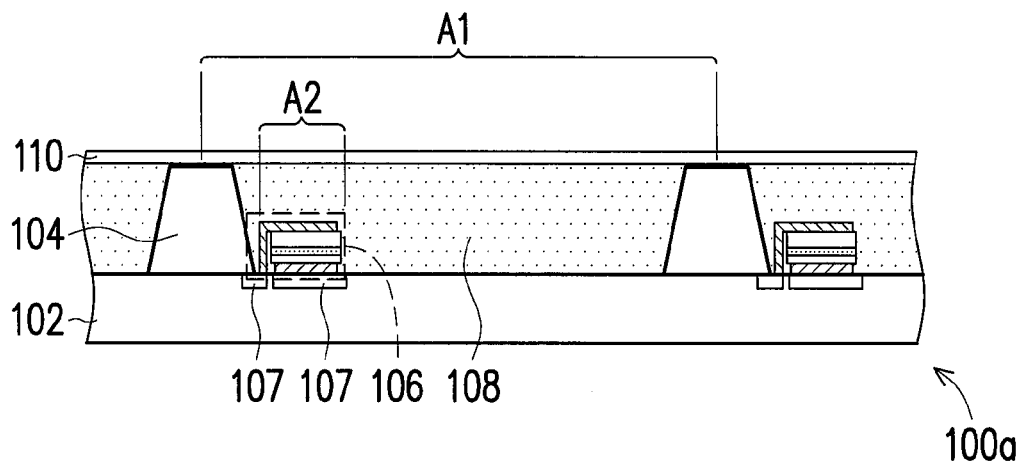
FIG. 2A is a schematic cross-sectional view of a portion of a display panel of the first embodiment of the disclosure.

FIG. 1 is a schematic top view of a portion of a display panel of the first embodiment of the disclosure. FIG. 2A is a schematic cross-sectional view of a portion of a display panel 100*a* of the first embodiment of the disclosure. Referring to FIG. 1 and FIG. 2A, the display panel 100*a* includes a substrate 102, a meshed shielding pattern 104, and a plurality of light-emitting devices 106.

The substrate 102 is a transparent substrate. Specifically, the transparent substrate indicates the substrate has a light transmittance above a certain degree, and the higher the light transmittance, the higher the transparency of the substrate. The substrate 102 may be a hard substrate or a flexible substrate. The material of the hard substrate is, for instance, glass, quartz, or silicon wafer. The material of the flexible substrate is, for instance, plastic. Moreover, a designed circuit layer 107 may first be disposed on the substrate 102 based on a desired layout for a component to be subsequently disposed on the substrate 102. The circuit layer 107 may be on the surface of the substrate 102 and may also be integrated into the interior of the substrate 102.

The meshed shielding pattern 104 is disposed on the substrate 102. The meshed shielding pattern 104 has a grid structure so as to define a plurality of pixel regions U on the substrate 102. In other words, the meshed shielding pattern 104 has, for instance, a plurality of openings H, wherein each opening of the openings exposes one pixel region U of the pixel regions U. The material of the meshed shielding pattern 104 may be, for instance, an organic polymer material, a photoresist, a metal, a dielectric material, an oxide, or a semiconductor.

The light-emitting devices 106 are disposed on the substrate 102. At least one light-emitting device 106 of the light-emitting devices may be disposed in each pixel region U of the pixel regions U. The present embodiment is exemplified by disposing one light-emitting device 106. The light-emitting device 106 may be a light-emitting diode (LED), an organic light-emitting diode (OLED), or other suitable light-emitting devices.

Figure 2B:
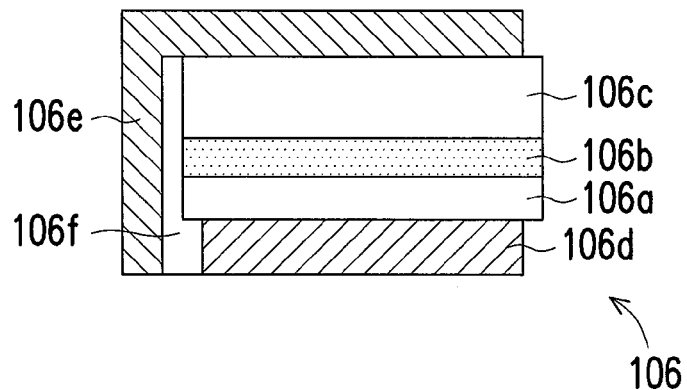
FIG. 2B is an enlarged schematic view of a light-emitting device of FIG. 2A.

FIG. 2B is an enlarged schematic view of the light-emitting device 106 of FIG. 2A, wherein the light-emitting device 106 is exemplified by a light-emitting diode. Referring to FIG. 2B, the light-emitting device 106 includes a first semiconductor layer 106a, a light-emitting layer 106b, a second semiconductor layer 106c, a first electrode 106d, a second electrode 106e, and an insulation layer 106f, wherein the light-emitting device 106 is, for instance, electrically connected to the circuit layer 107 on the substrate 102 through the first electrode 106d and the second electrode 106e. The structure of the light-emitting device 106 is known to those skilled in the art and is therefore not described herein.

Referring to FIG. 1 and FIG. 2A, an area occupied by each pixel region U of the pixel regions U is about 400 $\mu m^2$-1 $mm^2$. An area A2 occupied by each light-emitting device 106 of the light-emitting devices 106 is about 100 $\mu m^2$-0.1 $mm^2$, wherein the light-emitting devices 106 are substantially devices having lower light transmittance and therefore have low transparency. The regions occupied by the area A1 and the area A2 are as shown in FIG. 1. In the present embodiment, a ratio of A2 to A1 is below 50%. In other words, in each pixel region U of the pixel regions U, the area A2 occupied by the light-emitting device 106 having low transparency is only less than 50% of the area A1 of the pixel region U. Therefore, most of the areas of the pixel regions U may maintain high light transmittance, thus increasing the transparency of the display panel 100a. In another embodiment, the ratio of A2 to A1 is 0.01%-25%.

The display panel 100a further includes a diffusion adhesive 108. In the present embodiment, the diffusion adhesive 108 is disposed in the pixel regions U and covers the light-emitting devices 106. The diffusion adhesive 108 is, for instance, formed by dispersing a plurality of diffusion particles in transparent colloids. The diffusion particles in the diffusion adhesive 108 may help to transmit the light of the light-emitting devices 106 throughout the pixel regions U. Therefore, the function of light transmission of the diffusion adhesive 108 may facilitate a more uniform luminance in the entirety of the pixel regions U.

The display panel 100a further includes a cover layer 110. The cover layer 110 covers the meshed shielding pattern 104 and the diffusion adhesive 108. The cover layer 110 may be used to protect each device in the display panel 100a to lower the probability of damage to the display panel 100a.

Figure 3:
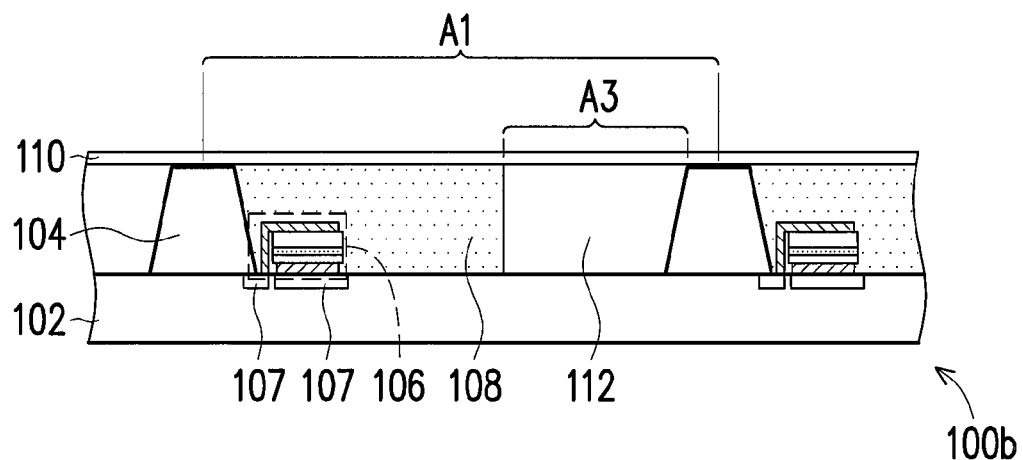
FIG. 3 is a schematic cross-sectional view of a portion of a display panel of the second embodiment of the disclosure.

Other embodiments are listed below for explanation, wherein the same reference numerals represent the same or similar components. Moreover, the top schematic views of the following number of embodiments are as shown in FIG. 1. FIG. 3 is a schematic cross-sectional view of a portion of a display panel of the second embodiment of the disclosure. Referring to FIG. 1 and FIG. 3, the display panel 100b is substantially similar to the display panel 100a of FIG. 2A, wherein the difference between the two is that the display panel 100b further includes an optical adhesive 112. The optical adhesive 112 is, for instance, transparent colloids having a certain degree of light transmittance, and may have the same material as the transparent colloids used in the diffusion adhesive 108, wherein since the diffusion adhesive 108 further includes a plurality of diffusion particles, the light transmittance of the optical adhesive 112 is higher than the overall light transmittance of the diffusion adhesive 108. Of course, the disclosure is not limited thereto. The material of the optical adhesive 112 may also be different from the material of the transparent colloids of the diffusion adhesive 108. Since the light transmittance of the optical adhesive 112 is greater than the light transmittance of the diffusion adhesive 108, the transparency of the display panel 100b may be further increased.

In the present embodiment, an area A3 occupied by the diffusion adhesive 108 is 200 $\mu m^2$-0.5 $mm^2$ and a ratio of A3 to A1 is 6%-65%. Specifically, using a full HD display as example, when the size of the pixel regions U is (630×630) $\mu m^2$ and the size of the light-emitting devices 106 is (20×20) $\mu m^2$, the desired brightness for display may be provided. The ratio is set according to the standard for retina display, wherein the optimal ratio is related to the pitch of the pixel regions U. In terms of a viewing distance of 40 cm, when the distance between two light spots is less than 116 $\mu m$, the human eye cannot distinguish the two light spots (commonly known as the retina display). In this instance, the ratio of A3 to A1 is preferably 65% (((630-116)/630)2≈65%). In terms of a viewing distance of 1 m, when the distance between the two light spots is less than 291 $\mu m$, the human eye cannot distinguish the two light spots. In this instance, the ratio of A3 to A1 is preferably 28% (((630-291)/630)2≈28%).

Figure 4:
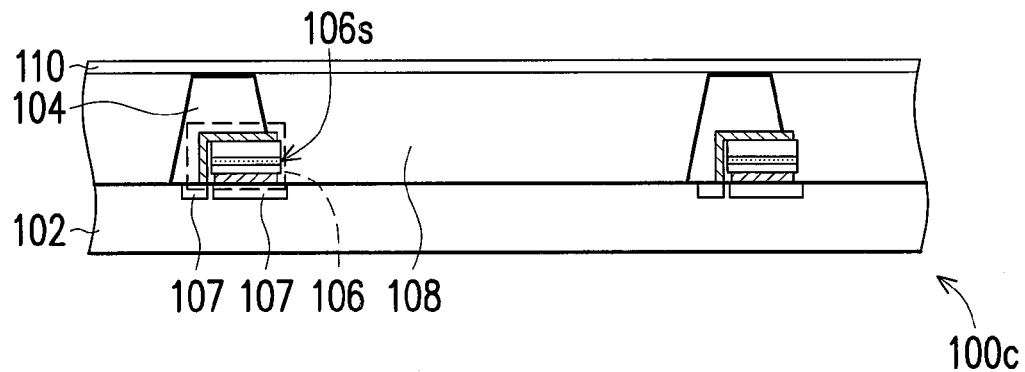
FIG. 4 is a schematic cross-sectional view of a portion of a display panel of the third embodiment of the disclosure.

FIG. 4 is a schematic cross-sectional view of a portion of a display panel of the third embodiment of the disclosure. Referring to FIG. 1 and FIG. 4, the display panel 100c is substantially similar to the display panel 100a of FIG. 2A, wherein the difference between the two is that the light-emitting devices 106 of the display panel 100c are partially disposed in the meshed shielding pattern 104. In other words, the light-emitting devices 106 are partially embedded in the meshed shielding pattern 104. The meshed shielding pattern 104 covers the light-emitting devices 106 and exposes a side 106s of the light-emitting devices 106. In the present embodiment, the light-emitting devices 106 provide a light source by emitting light from the side. Specifically, when the meshed shielding pattern 104 covers the light-emitting devices 106 such that the light-emitting devices 106 emit light from the side 106s, a reflective material may further be disposed in the light-emitting devices 106, and the reflective material is, for instance, disposed between the light-emitting devices 106 and the meshed shielding pattern 104 such that light is primarily emitted from the side 106s after being reflected by the reflective material.

When the meshed shielding pattern 104 completely covers the light exit surface of the light-emitting devices 106 except for the side 106s, the area A2 occupied by the light-emitting devices 106 is substantially zero, and therefore, the ratio of A2 to A1 is substantially zero. Moreover, the disclosure is not limited thereto. The meshed shielding pattern 104 may also only partially cover the light-emitting devices 106 such that the meshed shielding pattern 104 exposes the light exit surface of the light-emitting devices 106 except for the side 106s. In this instance, the area A2 occupied by the light-emitting devices 106 is substantially not zero.

Figure 5:
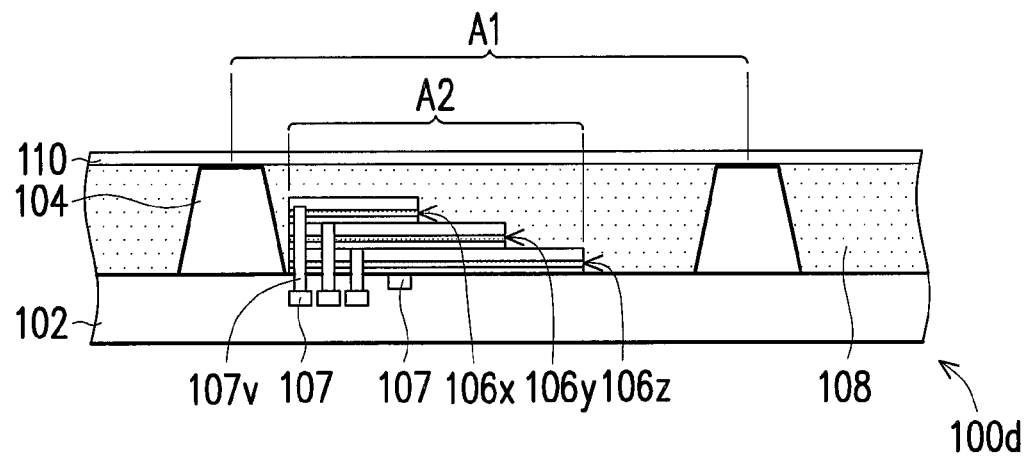
FIG. 5 is a schematic cross-sectional view of a portion of a display panel of the fourth embodiment of the disclosure.

FIG. 5 is a schematic cross-sectional view of a portion of a display panel of the fourth embodiment of the disclosure. Referring to FIG. 1 and FIG. 5, the display panel 100d is substantially similar to the display panel 100a of FIG. 2A, wherein the difference between the two is that three light-emitting devices are disposed in the pixel regions U of the display panel 100d. Specifically, light-emitting devices 106x, 106y, and 106z are stacked upon one another and each light-emitting device is at least partially exposed. For instance, since the light-emitting device 106y is stacked upon the light-emitting device 106z, the light-emitting device 106z is only partially exposed. Similarly, since the light-emitting device 106x is stacked upon the light-emitting device 106y, the light-emitting device 106y is only partially exposed. Moreover, the light-emitting device 106x is completely exposed. In the present embodiment, the light-emitting devices 106x, 106y, and 106z are respectively a red light-emitting device, a green light-emitting device, and a blue light-emitting device, and the same pixel region U may display three different colors. Therefore, the display panel 100d has higher resolution. Of course, the disclosure is not limited thereto, and those skilled in the art may design the colors of the light-emitting devices on their own based on need. The light-emitting device 106x, the light-emitting device 106y, and the light-emitting device 106z are electrically connected to the circuit layer 107 on the substrate 102 through a conductive via 107v.

Figure 6:
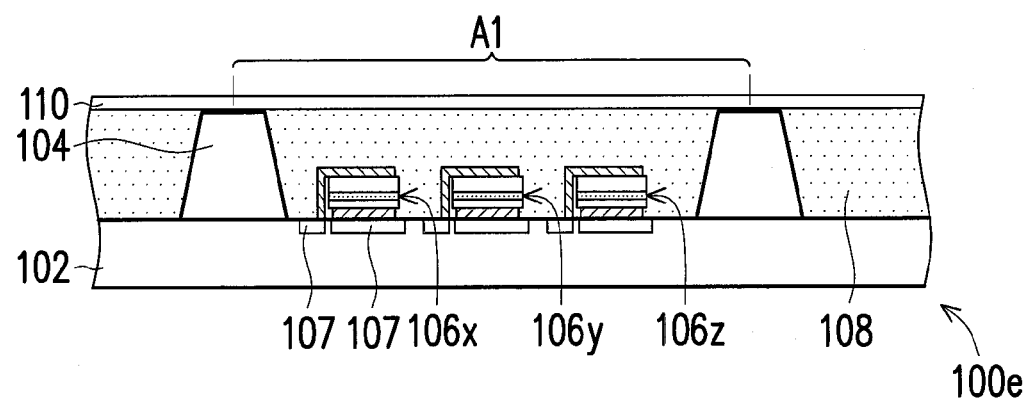
FIG. 6 is a schematic cross-sectional view of a portion of a display panel of the fifth embodiment of the disclosure.

FIG. 6 is a schematic cross-sectional view of a portion of a display panel of the fifth embodiment of the disclosure. Referring to FIG. 1 and FIG. 6, the display panel 100e is substantially similar to the display panel 100d of FIG. 5, wherein the difference between the two is that a plurality of light-emitting devices 106x, 106y, and 106z separate from one another are disposed in the pixel regions U of the display panel 100e. Specifically, the light-emitting devices 106x, 106y, and 106z are, for instance, disposed separately from one another, and each light-emitting device is completely exposed. In the present embodiment, the light-emitting devices 106x, 106y, and 106z are respectively a red light-emitting device, a green light-emitting device, and a blue light-emitting device, and the same pixel region U may display three different colors. Therefore, the display panel 100d has higher resolution. Of course, the disclosure is not limited thereto, and those skilled in the art may design the colors of the light-emitting devices on their own based on need.

Figure 7:
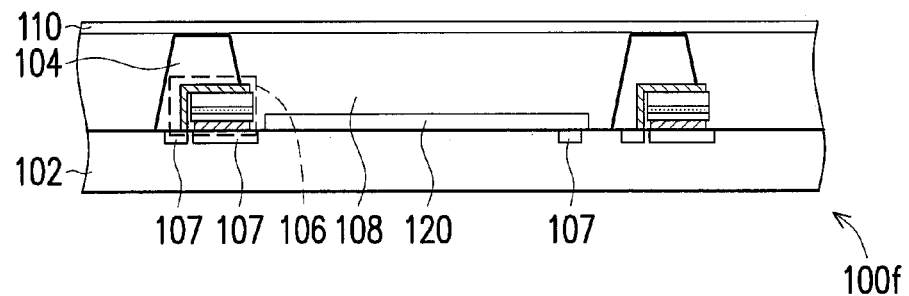
FIG. 7 is a schematic cross-sectional view of a portion of a display panel of the sixth embodiment of the disclosure.

FIG. 7 is a schematic cross-sectional view of a portion of a display panel of the sixth embodiment of the disclosure. Referring to FIG. 1 and FIG. 7, the display panel 100f is substantially similar to the display panel 100c of FIG. 4, wherein the difference between the two is that the display panel 100f further includes a plurality of solar cells 120 electrically connected to the circuit layer 107. Specifically, at least one solar cell 120 of the solar cells 120 is disposed in each pixel region U of the pixel regions U, wherein the solar cells 120 have a certain degree of inherent light transmittance. Moreover, when the solar cells 120 are in operation to absorb light, the degree of direct penetration by the light may be reduced. Therefore, grayscale control may be achieved such that the display panel 100f may have a better quality of deep color display. Moreover, after the solar cells 120 absorb light, power may be generated, wherein the power may, after treatment, be provided to the light-emitting devices 106 of the display panel 100f for use and reduce additional energy needed for the display panel 100f. Moreover, the present embodiment is exemplified by disposing the solar cells 120 in the display panel 100c. However, the disclosure is not limited thereto. In other embodiments, the solar cells 120 may also be integrated into the design of the display panels 100a and 100b.

Figure 8:
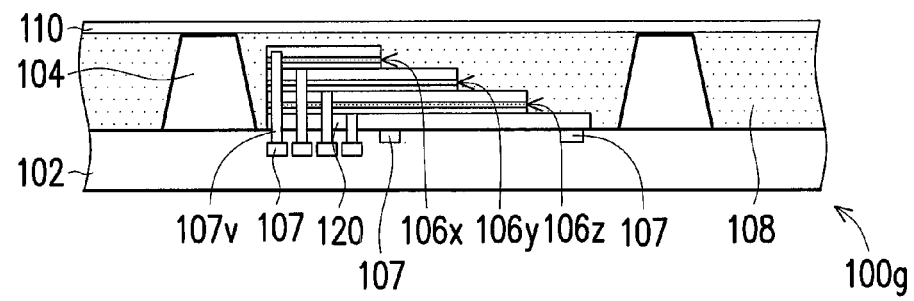
FIG. 8 is a schematic cross-sectional view of a portion of a display panel of the seventh embodiment of the disclosure.

FIG. 8 is a schematic cross-sectional view of a portion of a display panel of the seventh embodiment of the disclosure. Referring to FIG. 1 and FIG. 8, the display panel 100g is substantially similar to the display panel 100d of FIG. 6, wherein the difference between the two is that the display panel 100g further includes a plurality of solar cells 120 electrically connected to the circuit layer 107. At least one solar cell 120 of the solar cells 120 is disposed in each pixel region U of the pixel regions U, and the light-emitting devices 106x, 106y, and 106z stacked upon one another are disposed on the solar cells 120. Therefore, the light-emitting devices 106x, 106y, and 106z and the solar cells 120 are stacked upon one another. In the present embodiment, the light-emitting devices 106x, 106y, and 106z are stacked upon the solar cells 120, and the disclosure does not limit the stacking sequence of the light-emitting devices 106x, 106y, and 106z and the solar cells 120. Moreover, in other embodiments, the light-emitting devices 106x, 106y, and 106z stacked upon one another may also be disposed separately from the solar cells 120. In other words, the light-emitting devices 106x, 106y, and 106z and the solar cells 120 are not stacked upon one another.

Figure 9:
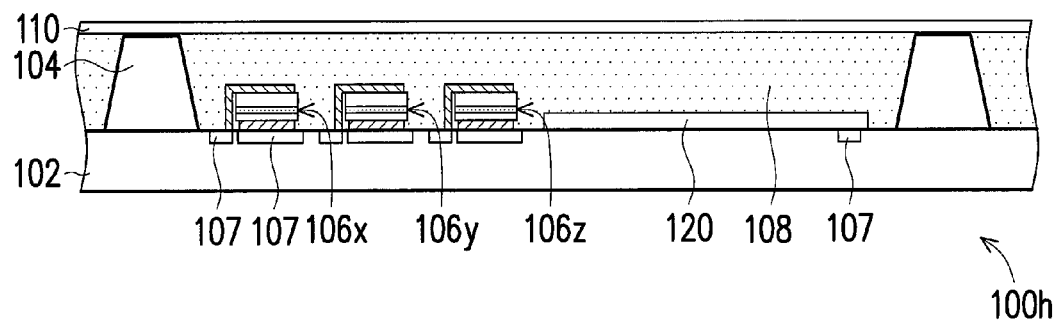
FIG. 9 is a schematic cross-sectional view of a portion of a display panel of the eighth embodiment of the disclosure.

FIG. 9 is a schematic cross-sectional view of a portion of a display panel of the eighth embodiment of the disclosure. Referring to FIG. 1 and FIG. 9, the display panel 100h is substantially similar to the display panel 100e of FIG. 6, wherein the difference between the two is that the display panel 100h further includes a plurality of solar cells 120 electrically connected to the circuit layer 107. At least one solar cell 120 of the solar cells 120 is disposed in each pixel region U of the pixel regions U. The light-emitting devices 106x, 106y, and 106z separate from one another are separate from the solar cells and are not stacked with the solar cells. Moreover, in other embodiments, the light-emitting devices 106x, 106y, and 106z separate from one another may also be stacked with the solar cells 120, wherein all of the light-emitting devices may be disposed on the solar cells 120, or a portion of the light-emitting devices may be disposed on the solar cells 120.

Figure 10:
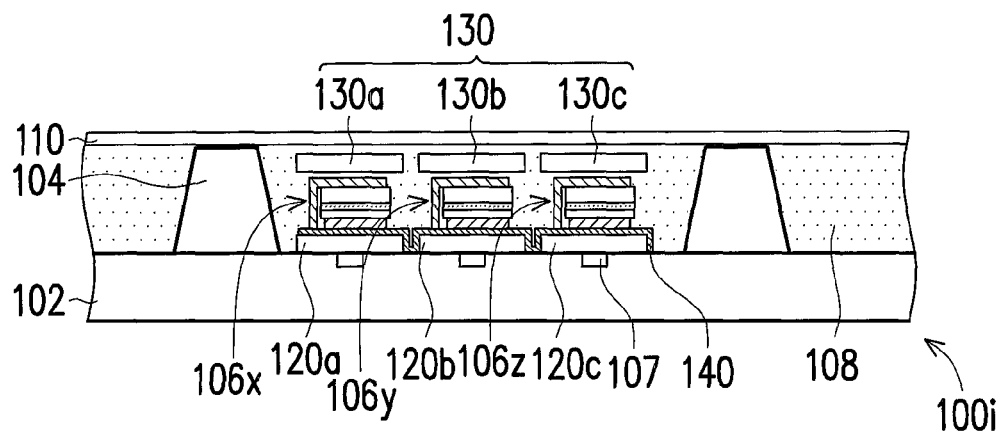
FIG. 10 is a schematic cross-sectional view of a portion of a display panel of the ninth embodiment of the disclosure.

FIG. 10 is a schematic cross-sectional view of a portion of a display panel of the ninth embodiment of the disclosure. Referring to FIG. 1 and FIG. 10, the display panel 100i is substantially similar to the display panel 100h of FIG. 9, wherein the difference between the two is that three solar cells 120a, 120b, and 120c are disposed in each pixel region U of the pixel regions U of the display panel 100i. The light-emitting devices 106x, 106y, and 106z are respectively disposed on the solar cells 120a, 120b, and 120c. Moreover, the display panel 100i further includes a color filter pattern 130. The color filter pattern 130 covers the light-emitting devices 106x, 106y, 106z and the solar cells 120a, 120b, 120c. The color filter pattern 130 includes first filter patterns 130a, 130b, and 130c, wherein the first filter patterns 130a, 130b, and 130c are, for instance, respectively a red filter pattern, a green filter pattern, and a blue filter pattern. The first filter patterns 130a, 130b, and 130c respectively cover the light-emitting devices 106x, 106y, and 106z and the solar cells 120a, 120b, and 120c.

As shown in FIG. 10, the solar cells 120a, 120b, and 120c and the light-emitting devices 106x, 106y, and 106z are all electrically connected to the third electrode 140. When the solar cells 120a, 120b, and 120c are in operation, the solar cells 120a, 120b, and 120c may respectively absorb the light passing through the first filter patterns 130a, 130b, and 130c to generate power. In other words, the solar cells 120a, 120b, and 120c may respectively detect red, green, and blue lights and generate electrical signals. Therefore, the display panel 100i further has the function of color image sensing, such as the function of color scanning.

Figure 11:
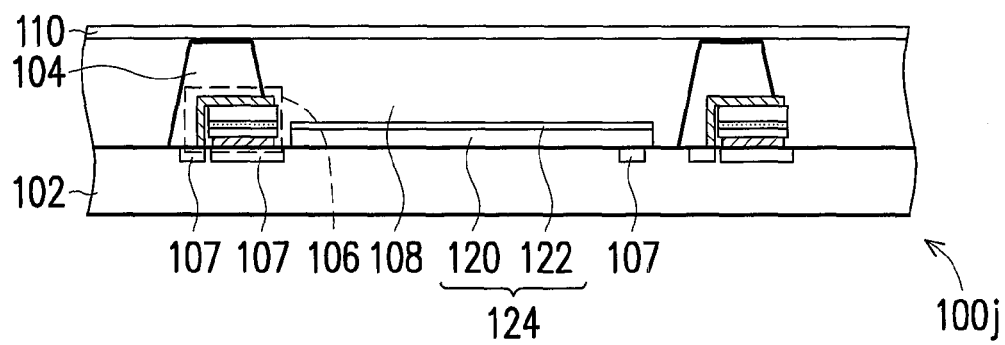
FIG. 11 is a schematic cross-sectional view of a portion of a display panel of the tenth embodiment of the disclosure.

FIG. 11 is a schematic cross-sectional view of a portion of a display panel of the tenth embodiment of the disclosure. Referring to FIG. 1 and FIG. 11, the display panel 100j is substantially similar to the display panel 100f of FIG. 7, wherein the difference between the two is that the display panel 100j further includes a plurality of electrochromic material layers 122. At least one electrochromic material layer 122 of the electrochromic material layers 122 is disposed in each pixel region U of the pixel regions U. The electrochromic material layers 122 are disposed on the solar cells 122, and the electrochromic material layers 122 and the solar cells 120 jointly form an electrochromic cell 124.

Specifically, in the electrochromic cell 124, a layer of electrochromic material layer 122 is, for instance, disposed on the transparent electrodes of the solar cells 120, wherein the electrochromic material layer 122 is, for instance, a substantially transparent tungsten oxide ($WO_3$) thin film, and the solar cells 120 are, for instance, dye-sensitized solar cells containing lithium-ion solid electrolyte. When the electrochromic cell 124 absorbs light and is in an open state with the external circuit, the current generated by the solar cells 120 are injected into the $WO_3$ thin film such that $WO_3$ is oxidized and forms the colored lithium tungsten bronze ($Li_xWO_3$). Then, when the electrochromic cell 124 is in a connected state with the external circuit, $Li_xWO_3$ returns to the original state of transparent $WO_3$. In this way, grayscale control of the display panel 100j may be achieved by controlling the presence of color in the electrochromic cell 124 such that the display panel 100j has good display quality. Moreover, those skilled in the art may design the relationship of configuration between the electrochromic material layers 122 and the solar cells 120 based on need. The disclosure is not limited to disposing the electrochromic material layers 122 on the surface of the solar cells 120. In other words, as long as the current of the solar cells 120 is injected into the electrochromic material layers 122 to control the color of the electrochromic material layers 122, the disposition of the electrochromic material layers 122 falls within the desired scope of the disclosure to be protected.

Figure 12:
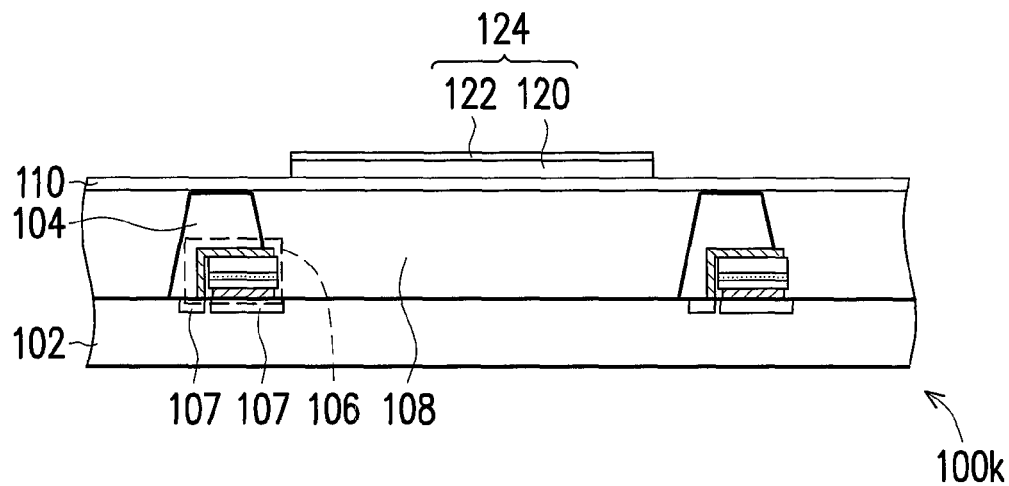
FIG. 12 is a schematic cross-sectional view of a portion of a display panel of the tenth embodiment of the disclosure.

FIG. 12 is a schematic cross-sectional view of a portion of a display panel of the eleventh embodiment of the disclosure. Referring to FIG. 1 and FIG. 12, the display panel 100k is substantially similar to the display panel 100j of FIG. 11, wherein the difference between the two is that the electrochromic cell 124 of the display panel 100k is disposed on the cover layer 110.

Based on the above, in the display panel of the disclosure, the ratio of the area of the light-emitting device to the area of the pixel region is relatively low, and therefore the transparency of the display panel may be increased. Moreover, solar cells are disposed in the display panel of the disclosure, and when the solar cells are in operation to absorb light, grayscale control of the display panel may be achieved so as to have a better quality of deep color display.

It will be apparent to those skilled in the art that various modifications and variations can be made to the structure of the disclosed embodiments without departing from the scope or spirit of the disclosure. In view of the foregoing, it is intended that the disclosure cover modifications and variations of this specification provided they fall within the scope of the following claims and their equivalents.

What is claimed is:

1. A display panel, comprising:
    a substrate;
    a circuit layer disposed on the substrate or integrated into the interior of the substrate;
    a meshed shielding pattern disposed on the substrate so as to define a plurality of pixel regions on the substrate; and
    a plurality of light-emitting devices disposed on the substrate, wherein the light-emitting devices are electrically connected to the circuit layer, and at least one light-emitting device of the light-emitting devices is disposed in each pixel region of the pixel regions wherein any one of the light-emitting devices is partially embedded in the meshed shielding pattern and the meshed shielding pattern at least exposes one side of the light-emitting device.

2. The display panel of claim 1, further comprising a diffusion adhesive disposed in one pixel region of the pixel regions, wherein the diffusion adhesive covers the at least one light-emitting device in the pixel region.

3. The display panel of claim 1, wherein the at least one light-emitting device comprises a plurality of light-emitting devices separate from one another.

4. The display panel of claim 1, further comprising a color filter pattern covering the at least one light-emitting device.

5. The display panel of claim 1, further comprising a cover layer covering the meshed shielding pattern.

6. The display panel of claim 3, further comprising a plurality of color filter patterns, and each of the color filter patterns covering one of the light-emitting devices respectively.

7. The display panel of claim 6, further comprising a cover layer covering the color filter patterns.

8. The display panel of claim 6, wherein the color filter patterns are positioned within the diffusion adhesive.

* * * * *